(12) United States Patent
Gazit

(10) Patent No.: US 9,917,587 B2
(45) Date of Patent: *Mar. 13, 2018

(54) FAST VOLTAGE LEVEL SHIFTER CIRCUIT

(71) Applicant: Solaredge Technologies Ltd., Herzeliya (IL)

(72) Inventor: Meir Gazit, Ashkelon (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/388,816

(22) Filed: Dec. 22, 2016

(65) Prior Publication Data

US 2017/0104487 A1 Apr. 13, 2017

Related U.S. Application Data

(63) Continuation of application No. 14/953,053, filed on Nov. 27, 2015, now Pat. No. 9,564,882, which is a continuation of application No. 14/279,830, filed on May 16, 2014, now Pat. No. 9,231,570, which is a continuation of application No. 13/015,064, filed on Jan. 27, 2011, now Pat. No. 8,766,696.

(60) Provisional application No. 61/298,555, filed on Jan. 27, 2010.

(51) Int. Cl.
*H03K 3/356* (2006.01)
*H03K 19/0185* (2006.01)

(52) U.S. Cl.
CPC .................. *H03K 19/018507* (2013.01)

(58) Field of Classification Search
CPC .............................................. H03K 19/018507
USPC ...................... 327/333; 326/80, 81
See application file for complete search history.

(56) References Cited

U.S. PATENT DOCUMENTS

| 2,758,219 A | 8/1956 | Miller |
| 3,369,210 A | 2/1968 | Manickella |
| 3,596,229 A | 7/1971 | Hohorst |
| 3,958,136 A | 5/1976 | Schroeder |

(Continued)

FOREIGN PATENT DOCUMENTS

| CN | 1309451 A | 8/2001 |
| CN | 1122905 C | 10/2003 |

(Continued)

OTHER PUBLICATIONS

Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.

(Continued)

*Primary Examiner* — Ryan Jager
(74) *Attorney, Agent, or Firm* — Banner & Witcoff, Ltd.

(57) ABSTRACT

A voltage level shifting circuit with an input terminal and an output terminal. The level shifting circuit has a field-effect transistor (FET) switch with a gate attached to the input terminal, a drain attached to the output terminal and a source attached to a current changing mechanism. The current changing mechanism includes a current mirror circuit having an output connected between the source and an electrical earth. The output of the current mirror circuit is preferably adapted to change a current flowing between the drain and the source based on an input voltage applied to the gate.

20 Claims, 5 Drawing Sheets

(56) References Cited

U.S. PATENT DOCUMENTS

| | | | |
|---|---|---|---|
| 4,060,757 A | 11/1977 | McMurray | |
| 4,101,816 A | 7/1978 | Shepter | |
| 4,146,785 A | 3/1979 | Neale | |
| 4,161,771 A | 7/1979 | Bates | |
| 4,171,861 A | 10/1979 | Hohorst | |
| 4,257,087 A | 3/1981 | Cuk | |
| 4,296,461 A | 10/1981 | Mallory et al. | |
| 4,346,341 A | 8/1982 | Blackburn et al. | |
| 4,452,867 A | 6/1984 | Conforti | |
| 4,460,232 A | 7/1984 | Sotolongo | |
| 4,481,654 A | 11/1984 | Daniels et al. | |
| 4,549,254 A | 10/1985 | Kissel | |
| 4,554,515 A | 11/1985 | Burson et al. | |
| 4,598,330 A | 7/1986 | Woodworth | |
| 4,602,322 A | 7/1986 | Merrick | |
| 4,623,753 A | 11/1986 | Feldman et al. | |
| 4,637,677 A | 1/1987 | Barkus | |
| 4,639,844 A | 1/1987 | Gallios et al. | |
| 4,641,042 A | 2/1987 | Miyazawa | |
| 4,641,079 A | 2/1987 | Kato et al. | |
| 4,644,458 A | 2/1987 | Harafuji et al. | |
| 4,652,770 A | 3/1987 | Kumano | |
| 4,685,040 A | 8/1987 | Steigerwald et al. | |
| 4,686,617 A | 8/1987 | Colton | |
| 4,706,181 A | 11/1987 | Mercer | |
| 4,720,667 A | 1/1988 | Lee et al. | |
| 4,720,668 A | 1/1988 | Lee et al. | |
| 4,783,728 A | 11/1988 | Hoffman | |
| RE33,057 E | 9/1989 | Clegg et al. | |
| 4,864,213 A | 9/1989 | Kido | |
| 4,868,379 A | 9/1989 | West | |
| 4,888,063 A | 12/1989 | Powell | |
| 4,888,702 A | 12/1989 | Gerken et al. | |
| 4,899,269 A | 2/1990 | Rouzies | |
| 4,903,851 A | 2/1990 | Slough | |
| 4,906,859 A | 3/1990 | Kobayashi et al. | |
| 4,910,518 A | 3/1990 | Kim et al. | |
| 4,978,870 A | 12/1990 | Chen et al. | |
| 4,987,360 A | 1/1991 | Thompson | |
| 5,045,988 A | 9/1991 | Gritter et al. | |
| 5,081,558 A | 1/1992 | Mahler | |
| 5,191,519 A | 3/1993 | Kawakami | |
| 5,280,232 A | 1/1994 | Kohl et al. | |
| 5,287,261 A | 2/1994 | Ehsani | |
| 5,289,361 A | 2/1994 | Vinciarelli | |
| 5,327,071 A | 7/1994 | Frederick et al. | |
| 5,345,375 A | 9/1994 | Mohan | |
| 5,402,060 A | 3/1995 | Erisman | |
| 5,446,645 A | 8/1995 | Shirahama et al. | |
| 5,451,898 A | 9/1995 | Johnson | |
| 5,460,546 A | 10/1995 | Kunishi et al. | |
| 5,493,154 A | 2/1996 | Smith et al. | |
| 5,497,289 A | 3/1996 | Sugishima et al. | |
| 5,517,378 A | 5/1996 | Asplund et al. | |
| 5,530,335 A | 6/1996 | Decker et al. | |
| 5,548,504 A | 8/1996 | Takehara | |
| 5,557,221 A * | 9/1996 | Taguchi | H03K 19/01858 327/112 |
| 5,563,780 A | 10/1996 | Goad | |
| 5,604,430 A | 2/1997 | Decker et al. | |
| 5,616,913 A | 4/1997 | Litterst | |
| 5,644,219 A | 7/1997 | Kurokawa | |
| 5,646,501 A | 7/1997 | Fishman et al. | |
| 5,659,465 A | 8/1997 | Flack et al. | |
| 5,686,766 A | 11/1997 | Tamechika | |
| 5,773,963 A | 6/1998 | Blanc et al. | |
| 5,777,515 A * | 7/1998 | Kimura | H03F 3/45183 330/257 |
| 5,777,858 A | 7/1998 | Rodulfo | |
| 5,780,092 A | 7/1998 | Agbo et al. | |
| 5,798,631 A | 8/1998 | Spee et al. | |
| 5,801,519 A | 9/1998 | Midya et al. | |
| 5,801,564 A | 9/1998 | Gasparik | |
| 5,804,894 A | 9/1998 | Leeson et al. | |
| 5,821,734 A | 10/1998 | Faulk | |
| 5,822,186 A | 10/1998 | Bull et al. | |
| 5,834,974 A * | 11/1998 | Kim | G11C 7/062 327/52 |
| 5,838,148 A | 11/1998 | Kurokami et al. | |
| 5,869,956 A | 2/1999 | Nagao et al. | |
| 5,873,738 A | 2/1999 | Shimada et al. | |
| 5,886,882 A | 3/1999 | Rodulfo | |
| 5,886,890 A | 3/1999 | Ishida et al. | |
| 5,892,354 A | 4/1999 | Nagao et al. | |
| 5,905,645 A | 5/1999 | Cross | |
| 5,917,722 A | 6/1999 | Singh | |
| 5,919,314 A | 7/1999 | Kim | |
| 5,923,158 A | 7/1999 | Kurokami et al. | |
| 5,930,128 A | 7/1999 | Dent | |
| 5,932,994 A | 8/1999 | Jo et al. | |
| 5,933,327 A | 8/1999 | Leighton et al. | |
| 5,945,806 A | 8/1999 | Faulk | |
| 5,949,668 A | 9/1999 | Schweighofer | |
| 5,961,739 A | 10/1999 | Osborne | |
| 5,963,010 A | 10/1999 | Hayashi et al. | |
| 5,990,659 A | 11/1999 | Frannhagen | |
| 6,002,290 A | 12/1999 | Avery et al. | |
| 6,028,458 A * | 2/2000 | Hamaguchi | H03F 1/0244 327/62 |
| 6,031,736 A | 2/2000 | Takehara et al. | |
| 6,037,720 A | 3/2000 | Wong et al. | |
| 6,038,148 A | 3/2000 | Farrington et al. | |
| 6,046,919 A | 4/2000 | Madenokouji et al. | |
| 6,050,779 A | 4/2000 | Nagao et al. | |
| 6,078,511 A | 6/2000 | Fasullo et al. | |
| 6,081,104 A | 6/2000 | Kern | |
| 6,082,122 A | 7/2000 | Madenokouji et al. | |
| 6,087,738 A | 7/2000 | Hammond | |
| 6,105,317 A | 8/2000 | Tomiuchi et al. | |
| 6,111,188 A | 8/2000 | Kurokami et al. | |
| 6,111,391 A | 8/2000 | Cullen | |
| 6,111,767 A | 8/2000 | Handleman | |
| 6,163,086 A | 12/2000 | Choo | |
| 6,166,455 A | 12/2000 | Li | |
| 6,166,527 A | 12/2000 | Dwelley et al. | |
| 6,169,678 B1 | 1/2001 | Kondo et al. | |
| 6,204,654 B1 * | 3/2001 | Miranda | G05F 1/562 323/299 |
| 6,219,623 B1 | 4/2001 | Wills | |
| 6,255,360 B1 | 7/2001 | Domschke et al. | |
| 6,256,234 B1 | 7/2001 | Keeth et al. | |
| 6,259,234 B1 | 7/2001 | Perol | |
| 6,262,558 B1 | 7/2001 | Weinberg | |
| 6,285,572 B1 | 9/2001 | Onizuka et al. | |
| 6,292,379 B1 | 9/2001 | Edevold et al. | |
| 6,301,128 B1 | 10/2001 | Jang et al. | |
| 6,304,065 B1 | 10/2001 | Wittenbreder | |
| 6,320,769 B2 | 11/2001 | Kurokami et al. | |
| 6,339,538 B1 | 1/2002 | Handleman | |
| 6,351,130 B1 | 2/2002 | Preiser et al. | |
| 6,369,462 B1 | 4/2002 | Sin | |
| 6,380,719 B2 | 4/2002 | Underwood et al. | |
| 6,396,170 B1 | 5/2002 | Laufenberg et al. | |
| 6,433,522 B1 | 8/2002 | Sin | |
| 6,441,597 B1 | 8/2002 | Lethellier | |
| 6,448,489 B2 | 9/2002 | Kimura et al. | |
| 6,452,814 B1 | 9/2002 | Wittenbreder | |
| 6,469,919 B1 | 10/2002 | Bennett | |
| 6,483,203 B1 | 11/2002 | McCormack | |
| 6,493,246 B2 | 12/2002 | Suzui et al. | |
| 6,507,176 B2 | 1/2003 | Wittenbreder, Jr. | |
| 6,531,848 B1 | 3/2003 | Chitsazan et al. | |
| 6,545,211 B1 | 4/2003 | Mimura | |
| 6,548,205 B2 | 4/2003 | Leung et al. | |
| 6,587,051 B2 | 7/2003 | Takehara et al. | |
| 6,590,793 B1 | 7/2003 | Nagao et al. | |
| 6,593,521 B2 | 7/2003 | Kobayashi | |
| 6,608,468 B2 | 8/2003 | Nagase | |
| 6,611,130 B2 | 8/2003 | Chang | |
| 6,611,441 B2 | 8/2003 | Kurokami et al. | |
| 6,628,011 B2 | 9/2003 | Droppo et al. | |
| 6,633,824 B2 | 10/2003 | Dollar, II | |
| 6,650,031 B1 | 11/2003 | Goldack | |
| 6,650,560 B2 | 11/2003 | MacDonald et al. | |

(56) References Cited

U.S. PATENT DOCUMENTS

| | | |
|---|---|---|
| 6,653,549 B2 | 11/2003 | Matsushita et al. |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,781 B1 | 2/2004 | Kroker |
| 6,731,136 B2 | 5/2004 | Knee |
| 6,738,692 B2 | 5/2004 | Schienbein et al. |
| 6,744,643 B2 | 6/2004 | Luo et al. |
| 6,765,315 B2 | 7/2004 | Hammerstrom et al. |
| 6,768,047 B2 | 7/2004 | Chang et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,801,442 B2 | 10/2004 | Suzui et al. |
| 6,810,339 B2 | 10/2004 | Wills |
| 6,850,074 B2 | 2/2005 | Adams et al. |
| 6,882,131 B1 | 4/2005 | Takada et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,936,995 B2 | 8/2005 | Kapsokavathis et al. |
| 6,950,323 B2 | 9/2005 | Achleitner et al. |
| 6,963,147 B2 | 11/2005 | Kurokami et al. |
| 6,984,967 B2 | 1/2006 | Notman |
| 6,984,970 B2 | 1/2006 | Capel |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,042,195 B2 | 5/2006 | Tsunetsugu et al. |
| 7,046,531 B2 | 5/2006 | Zocchi et al. |
| 7,053,506 B2 | 5/2006 | Alonso et al. |
| 7,072,194 B2 | 7/2006 | Nayar et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,148,669 B2 | 12/2006 | Maksimovic et al. |
| 7,158,359 B2 | 1/2007 | Bertele et al. |
| 7,158,395 B2 | 1/2007 | Deng et al. |
| 7,174,973 B1 | 2/2007 | Lysaght |
| 7,193,872 B2 | 3/2007 | Siri |
| 7,218,541 B2 | 5/2007 | Price et al. |
| 7,236,015 B2 * | 6/2007 | Eberlein .................. H03F 3/45 327/65 |
| 7,248,946 B2 | 7/2007 | Bashaw et al. |
| 7,256,566 B2 | 8/2007 | Bhavaraju et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,291,036 B1 | 11/2007 | Daily et al. |
| RE39,976 E | 1/2008 | Schiff et al. |
| 7,336,056 B1 | 2/2008 | Dening |
| 7,348,802 B2 | 3/2008 | Kasanyal et al. |
| 7,352,154 B2 | 4/2008 | Cook |
| 7,352,207 B2 * | 4/2008 | Garlapati ............. H03F 3/3061 326/62 |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,394,237 B2 | 7/2008 | Chou et al. |
| 7,420,815 B2 | 9/2008 | Love |
| 7,435,134 B2 | 10/2008 | Lenox |
| 7,435,897 B2 | 10/2008 | Russell |
| 7,443,052 B2 | 10/2008 | Wendt et al. |
| 7,456,523 B2 | 11/2008 | Kobayashi |
| 7,471,014 B2 | 12/2008 | Lum et al. |
| 7,495,419 B1 | 2/2009 | Ju |
| 7,504,811 B2 | 3/2009 | Watanabe et al. |
| 7,589,437 B2 | 9/2009 | Henne et al. |
| 7,600,349 B2 | 10/2009 | Liebendorfer |
| 7,602,080 B1 | 10/2009 | Hadar et al. |
| 7,605,498 B2 | 10/2009 | Ledenev et al. |
| 7,612,283 B2 | 11/2009 | Toyomura et al. |
| 7,646,116 B2 | 1/2010 | Batarseh et al. |
| 7,709,727 B2 | 5/2010 | Roehrig et al. |
| 7,719,140 B2 | 5/2010 | Ledenev et al. |
| 7,748,175 B2 | 7/2010 | Liebendorfer |
| 7,759,575 B2 | 7/2010 | Jones et al. |
| 7,763,807 B2 | 7/2010 | Richter |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,812,701 B2 | 10/2010 | Lee et al. |
| 7,839,022 B2 | 11/2010 | Wolfs |
| 7,843,085 B2 | 11/2010 | Ledenev et al. |
| 7,864,497 B2 | 1/2011 | Quardt et al. |
| 7,868,599 B2 | 1/2011 | Rahman et al. |
| 7,880,334 B2 | 2/2011 | Evans et al. |
| 7,893,346 B2 | 2/2011 | Nachamkin et al. |
| 7,900,361 B2 | 3/2011 | Adest et al. |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 8,003,885 B2 | 8/2011 | Richter et al. |
| 8,004,116 B2 | 8/2011 | Ledenev et al. |
| 8,004,117 B2 | 8/2011 | Adest et al. |
| 8,013,472 B2 | 9/2011 | Adest et al. |
| 8,018,748 B2 | 9/2011 | Leonard |
| 8,058,747 B2 | 11/2011 | Avrutsky et al. |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,093,756 B2 | 1/2012 | Porter et al. |
| 8,093,757 B2 | 1/2012 | Wolfs |
| 8,098,055 B2 | 1/2012 | Avrutsky et al. |
| 8,102,144 B2 | 1/2012 | Capp et al. |
| 8,111,052 B2 | 2/2012 | Glovinsky |
| 8,116,103 B2 | 2/2012 | Zacharias et al. |
| 8,138,914 B2 | 3/2012 | Wong et al. |
| 8,184,460 B2 | 5/2012 | O'Brien et al. |
| 8,204,709 B2 | 6/2012 | Presher, Jr. et al. |
| 8,217,721 B1 * | 7/2012 | Hsieh .................. H03F 3/45219 330/255 |
| 8,289,742 B2 | 10/2012 | Adest et al. |
| 8,415,937 B2 | 4/2013 | Hester |
| 8,436,592 B2 | 5/2013 | Saitoh |
| 8,570,017 B2 | 10/2013 | Perichon et al. |
| 8,749,275 B2 | 6/2014 | Inoue |
| 2001/0023703 A1 | 9/2001 | Kondo et al. |
| 2001/0034982 A1 | 11/2001 | Nagao et al. |
| 2002/0044473 A1 | 4/2002 | Toyomura et al. |
| 2002/0056089 A1 | 5/2002 | Houston |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0075211 A1 | 4/2003 | Makita et al. |
| 2003/0080741 A1 | 5/2003 | LeRow et al. |
| 2003/0214274 A1 | 11/2003 | Lethellier |
| 2004/0004402 A1 | 1/2004 | Kippley |
| 2004/0041548 A1 | 3/2004 | Perry |
| 2004/0061527 A1 | 4/2004 | Knee |
| 2004/0125618 A1 | 7/2004 | De Rooij et al. |
| 2004/0140719 A1 | 7/2004 | Vulih et al. |
| 2004/0169499 A1 | 9/2004 | Huang et al. |
| 2004/0201279 A1 | 10/2004 | Templeton |
| 2004/0201933 A1 | 10/2004 | Blanc |
| 2004/0246226 A1 | 12/2004 | Moon |
| 2005/0002214 A1 | 1/2005 | Deng et al. |
| 2005/0005785 A1 | 1/2005 | Poss et al. |

(56) References Cited

U.S. PATENT DOCUMENTS

| | | |
|---|---|---|
| 2005/0017697 A1 | 1/2005 | Capel |
| 2005/0057214 A1 | 3/2005 | Matan |
| 2005/0057215 A1 | 3/2005 | Matan |
| 2005/0068820 A1 | 3/2005 | Radosevich et al. |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0121067 A1 | 6/2005 | Toyomura et al. |
| 2005/0162018 A1 | 7/2005 | Realmuto et al. |
| 2005/0172995 A1 | 8/2005 | Rohrig et al. |
| 2005/0194937 A1 | 9/2005 | Jacobs |
| 2005/0226017 A1 | 10/2005 | Kotsopoulos et al. |
| 2005/0281064 A1 | 12/2005 | Olsen et al. |
| 2006/0001406 A1 | 1/2006 | Matan |
| 2006/0017327 A1 | 1/2006 | Siri et al. |
| 2006/0025081 A1 | 2/2006 | Zolfaghari |
| 2006/0034106 A1 | 2/2006 | Johnson |
| 2006/0038692 A1 | 2/2006 | Schnetker |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0108979 A1 | 5/2006 | Daniel et al. |
| 2006/0113843 A1 | 6/2006 | Beveridge |
| 2006/0113979 A1 | 6/2006 | Ishigaki et al. |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0162772 A1 | 7/2006 | Presher et al. |
| 2006/0163946 A1 | 7/2006 | Henne et al. |
| 2006/0171182 A1 | 8/2006 | Siri et al. |
| 2006/0174939 A1 | 8/2006 | Matan |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0227578 A1 | 10/2006 | Datta et al. |
| 2006/0237058 A1 | 10/2006 | McClintock et al. |
| 2007/0013349 A1 | 1/2007 | Bassett |
| 2007/0030068 A1 | 2/2007 | Motonobu et al. |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0133241 A1 | 6/2007 | Mumtaz et al. |
| 2007/0147075 A1 | 6/2007 | Bang |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0227574 A1 | 10/2007 | Cart |
| 2007/0236187 A1 | 10/2007 | Wai et al. |
| 2007/0247877 A1 | 10/2007 | Kwon et al. |
| 2007/0273342 A1 | 11/2007 | Kataoka et al. |
| 2007/0290636 A1 | 12/2007 | Beck et al. |
| 2008/0024098 A1 | 1/2008 | Hojo |
| 2008/0080177 A1 | 4/2008 | Chang |
| 2008/0088184 A1 | 4/2008 | Tung et al. |
| 2008/0097655 A1 | 4/2008 | Hadar et al. |
| 2008/0106250 A1 | 5/2008 | Prior et al. |
| 2008/0111530 A1 | 5/2008 | Hasegawa et al. |
| 2008/0115823 A1 | 5/2008 | Kinsey |
| 2008/0136367 A1 | 6/2008 | Adest et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0150366 A1 | 6/2008 | Adest et al. |
| 2008/0164766 A1 | 7/2008 | Adest et al. |
| 2008/0179949 A1 | 7/2008 | Besser et al. |
| 2008/0218152 A1 | 9/2008 | Bo |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0303503 A1 | 12/2008 | Wolfs |
| 2009/0039852 A1 | 2/2009 | Fishelov et al. |
| 2009/0066399 A1 | 3/2009 | Chen et al. |
| 2009/0073726 A1 | 3/2009 | Babcock |
| 2009/0084570 A1 | 4/2009 | Gherardini et al. |
| 2009/0097172 A1 | 4/2009 | Bremicker et al. |
| 2009/0102440 A1 | 4/2009 | Coles |
| 2009/0121549 A1 | 5/2009 | Leonard |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0184746 A1 | 7/2009 | Fahrenbruch |
| 2009/0190275 A1 | 7/2009 | Gilmore et al. |
| 2009/0206666 A1 | 8/2009 | Sella et al. |
| 2009/0217965 A1 | 9/2009 | Dougal et al. |
| 2009/0224817 A1 | 9/2009 | Nakamura et al. |
| 2009/0237042 A1 | 9/2009 | Glovinski |
| 2009/0237043 A1 | 9/2009 | Glovinsky |
| 2009/0242011 A1 | 10/2009 | Proisy et al. |
| 2009/0273241 A1 | 11/2009 | Gazit et al. |
| 2009/0282755 A1 | 11/2009 | Abbott et al. |
| 2009/0284998 A1 | 11/2009 | Zhang et al. |
| 2009/0322494 A1 | 12/2009 | Lee |
| 2010/0001587 A1 | 1/2010 | Casey et al. |
| 2010/0052735 A1 | 3/2010 | Burkland et al. |
| 2010/0085670 A1 | 4/2010 | Palaniswami et al. |
| 2010/0124027 A1 | 5/2010 | Handelsman et al. |
| 2010/0127571 A1 | 5/2010 | Hadar et al. |
| 2010/0139743 A1 | 6/2010 | Hadar et al. |
| 2010/0176773 A1 | 7/2010 | Capel |
| 2010/0181957 A1 | 7/2010 | Goeltner |
| 2010/0214808 A1 | 8/2010 | Rodriguez |
| 2010/0244575 A1 | 9/2010 | Coccia et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0294528 A1 | 11/2010 | Sella et al. |
| 2010/0294903 A1 | 11/2010 | Shmukler et al. |
| 2010/0297860 A1 | 11/2010 | Shmukler et al. |
| 2010/0301991 A1 | 12/2010 | Sella et al. |
| 2010/0308662 A1 | 12/2010 | Schatz et al. |
| 2011/0006743 A1 | 1/2011 | Fabbro |
| 2011/0037600 A1 | 2/2011 | Takehara et al. |
| 2011/0043172 A1 | 2/2011 | Dearn |
| 2011/0079263 A1 | 4/2011 | Avrutsky |
| 2011/0084553 A1 | 4/2011 | Adest et al. |
| 2011/0114154 A1 | 5/2011 | Lichy et al. |
| 2011/0115295 A1 | 5/2011 | Moon et al. |
| 2011/0121652 A1 | 5/2011 | Sella et al. |
| 2011/0125431 A1 | 5/2011 | Adest et al. |
| 2011/0133552 A1 | 6/2011 | Binder et al. |
| 2011/0139213 A1 | 6/2011 | Lee |
| 2011/0140536 A1 | 6/2011 | Adest et al. |
| 2011/0181251 A1 | 7/2011 | Porter et al. |
| 2011/0181340 A1 | 7/2011 | Gazit |
| 2011/0210611 A1 | 9/2011 | Ledenev et al. |
| 2011/0227411 A1 | 9/2011 | Arditi |
| 2011/0254372 A1 | 10/2011 | Haines et al. |
| 2011/0260866 A1 | 10/2011 | Avrutsky et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0285205 A1 | 11/2011 | Ledenev et al. |
| 2011/0290317 A1 | 12/2011 | Naumovitz et al. |
| 2011/0291486 A1 | 12/2011 | Adest et al. |
| 2011/0316346 A1 | 12/2011 | Porter et al. |
| 2012/0007613 A1 | 1/2012 | Gazit |
| 2012/0013362 A1 | 1/2012 | Hirose et al. |
| 2012/0019966 A1 | 1/2012 | DeBoer |
| 2012/0032515 A1 | 2/2012 | Ledenev et al. |
| 2012/0048325 A1 | 3/2012 | Matsuo et al. |
| 2012/0081009 A1 | 4/2012 | Shteynberg et al. |

(56) References Cited

U.S. PATENT DOCUMENTS

| | | |
|---|---|---|
| 2012/0091810 A1 | 4/2012 | Aiello et al. |
| 2012/0113554 A1 | 5/2012 | Paoletti et al. |
| 2013/0120027 A1 | 5/2013 | Inoue |

FOREIGN PATENT DOCUMENTS

| | | |
|---|---|---|
| CN | 101136129 A | 3/2008 |
| CN | 101488271 A | 7/2009 |
| CN | 101523230 A | 9/2009 |
| DE | 19737286 A1 | 3/1999 |
| DE | 102005030907 A1 | 1/2007 |
| DE | 102008057874 A1 | 5/2010 |
| EP | 419093 A2 | 3/1991 |
| EP | 420295 A1 | 4/1991 |
| EP | 604777 A1 | 7/1994 |
| EP | 756178 A2 | 1/1997 |
| EP | 827254 A2 | 3/1998 |
| EP | 1039621 A2 | 9/2000 |
| EP | 1047179 A1 | 10/2000 |
| EP | 1330009 A2 | 7/2003 |
| EP | 1503490 A1 | 2/2005 |
| EP | 1531542 A2 | 5/2005 |
| EP | 1531545 A2 | 5/2005 |
| EP | 1657557 A1 | 5/2006 |
| EP | 1657797 A1 | 5/2006 |
| EP | 1887675 A2 | 2/2008 |
| EP | 2048679 A1 | 4/2009 |
| EP | 2315328 A2 | 4/2011 |
| EP | 2393178 A2 | 12/2011 |
| ES | 2249147 A1 | 3/2006 |
| ES | 2249149 A1 | 3/2006 |
| GB | 2476508 A | 6/2011 |
| GB | 2480015 A | 11/2011 |
| GB | 2480015 B | 11/2011 |
| JP | 61065320 A | 4/1986 |
| JP | 8009557 A | 1/1996 |
| JP | 11041832 A | 2/1999 |
| JP | 11103538 A | 4/1999 |
| JP | 11206038 A | 7/1999 |
| JP | 11289891 A | 10/1999 |
| JP | 11318042 A | 11/1999 |
| JP | 2000174307 A | 6/2000 |
| JP | 2000339044 A | 12/2000 |
| JP | 2001189476 A | 7/2001 |
| JP | 2002300735 A | 10/2002 |
| JP | 2003124492 A | 4/2003 |
| JP | 2003134667 A | 5/2003 |
| JP | 2004194500 A | 7/2004 |
| JP | 2004260944 A | 9/2004 |
| JP | 2004334704 A | 11/2004 |
| JP | 2005192314 A | 7/2005 |
| JP | 2007058845 A | 3/2007 |
| WO | 1993013587 A1 | 7/1993 |
| WO | 1996013093 A1 | 5/1996 |
| WO | 1998023021 A2 | 5/1998 |
| WO | 00/00839 A1 | 1/2000 |
| WO | 00/21178 A1 | 4/2000 |
| WO | 0075947 A1 | 12/2000 |
| WO | 0231517 | 4/2002 |
| WO | 2003050938 A2 | 6/2003 |
| WO | 2003071655 A1 | 8/2003 |
| WO | 2004023278 A2 | 3/2004 |
| WO | 2004090993 A2 | 10/2004 |
| WO | 2004098261 A2 | 11/2004 |
| WO | 2004107543 A2 | 12/2004 |
| WO | 2005076444 A1 | 8/2005 |
| WO | 2005076445 A1 | 8/2005 |
| WO | 2006005125 A1 | 1/2006 |
| WO | 2006007198 A1 | 1/2006 |
| WO | 2006078685 A2 | 7/2006 |
| WO | 2007006564 A2 | 1/2007 |
| WO | 2007048421 A2 | 5/2007 |
| WO | 2007073951 A1 | 7/2007 |
| WO | 2007084196 A2 | 7/2007 |
| WO | 2007090476 A2 | 8/2007 |
| WO | 2007113358 A1 | 10/2007 |
| WO | 2008008528 A2 | 1/2008 |
| WO | 2008125915 A2 | 10/2008 |
| WO | 2008132551 A2 | 11/2008 |
| WO | 2008132553 A2 | 11/2008 |
| WO | 2008142480 A2 | 11/2008 |
| WO | 2009007782 A2 | 1/2009 |
| WO | 2009046533 A1 | 4/2009 |
| WO | 2009051853 A1 | 4/2009 |
| WO | 2009118682 A2 | 10/2009 |
| WO | 2009118683 A2 | 10/2009 |
| WO | 2009073868 A1 | 11/2009 |
| WO | 2009136358 A1 | 11/2009 |
| WO | 2010/002960 A1 | 1/2010 |
| WO | 2010065043 A1 | 6/2010 |
| WO | 2010065388 A1 | 6/2010 |
| WO | 2010072717 A1 | 7/2010 |
| WO | 2010078303 A2 | 7/2010 |
| WO | 2010094012 A1 | 8/2010 |
| WO | 20100134057 A1 | 11/2010 |
| WO | 2011011711 A2 | 1/2011 |
| WO | 2011017721 A1 | 2/2011 |
| WO | 2011023732 A2 | 3/2011 |
| WO | 2011059067 A1 | 5/2011 |
| WO | 2011074025 A1 | 6/2011 |

OTHER PUBLICATIONS

Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA, IEEE, US, vol. 1, Jun. 22, 1997, pp. 233-239, XP-10241553, ISBN: 978-0-7803-3840-1, pp. 233-236.

International Search Report and Opinion of International Patent Application PCT/2009/051221, dated Oct. 19, 2009.

Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.

Duarte, "A Family of ZVX-PWM Active-Clamping DC-to-DC Converters: Synthesis, Analysis, and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP01061283 ISBN: 978-0-7803-2750-4 p. 503-504.

International Search Reprot and Opinion of International Patent Application PCT/2009/051222, dated Oct. 7, 2009.

Communication in EP0784025.5 dated Aug. 17, 2011.

IPRP for PCT/IB2008/055095 dated Jun. 8, 2010, with Written Opinion.

ISR for PCT/IB2008/055095 dated Apr. 30, 2009.

IPRP for PCT/IL2007/001064 dated Mar. 17, 2009, with Written Opinoin dated Mar. 25, 2008.

ISR for PCT/IL07/01064 dated Mar. 25, 2008.

IPRP for PCT/IB2007/004584 dated Jun. 10, 2009, with Written Opinion.

IPRP for PCT/IB2007/004586 dated Jun. 10, 2009, with Written Opinion.

IPRP for PCT/IB2007/004591 dated Jul. 13, 2010, with Written Opinion.

IPRP for PCT/IB2007/004643 dated Jun. 10, 2009, with Written Opinion.

Written Opinion for PCT/IB2008/055092 submitted with IPRP dated Jun. 8, 2010.

IPRP for PCT/US2008/085754 dated Jun. 8, 2010, with Written Opinion dated Jan. 21, 2009.

IPRP for PCT/US2008/085755 dated Jun. 8, 2010, with Written Opinion dated Jan. 20, 2009.

IPRP for PCT/IB2009/051221 dated Sep. 28, 2010, with Written Opinion.

IPRP for PCT/IB2009/051222 dated Sep. 28, 2010, with Written Opinion.

(56) References Cited

OTHER PUBLICATIONS

IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section 18(3), Sep. 16, 2011.
UK Intellectual Property Office, Patents Act 1977: Patents Rules Notification of Grant: Patent Serial No. GB2480015, Nov. 29, 2011.
Geoffrey R. Walker Affidavit re: U.S. Appl. No. 11/950,307, submitted in an IDS for U.S. Appl. No. 11/950,271 on Mar. 9, 2010.
Geoffrey R. Walker Affidavit re: U.S. Appl. No. 11/950,271, submitted in an IDS for U.S. Appl. No. 11/950,271 on Mar. 9, 2010.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—dated Jun. 10, 2009.
Extended European Search Report—EP12176089.6—dated Nov. 8, 2012.
Gwon-Jong Yu et al: "Maximum power point tracking with temperature compensation of photovoltaic for air conditioning system with fuzzy controller", 19960513; 19960513-19960517, May 13, 1996 ( May 13, 1996), pp. 1429-1432, XP010208423.
Extended European Search Report—EP12177067.1—dated Dec. 7, 2012.
GB Combined Search and Examination Report—GB1200423.0—dated Apr. 30, 2012.
GB Combined Search and Examination Report—GB1201499.9—dated May 28, 2012.
GB Combined Search and Examination Report—GB1201506.1—dated May 22, 2012.
GB Combined Search and Examination Report—GB1203763.6—dated Jun. 25, 2012.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
"Study of Energy Storage Capacitor Reduction for Single Phase PWM Rectifier", Ruxi Wang et al., Virginia Polytechnic Institute and State University, Feb. 2009.
"Multilevel Inverters: A Survey of Topologies, Controls, and Applications", José Rodríguez et al., IEEE Transactions on Industrial Electronics, vol. 49, No. 4, Aug. 2002.
Extended European Search Report—EP 08878650.4—dated Mar. 28, 2013.
Satcon Solstice—Satcon Solstice 100 kW System Solution Sheet—2010.
Robert W. Erickson, "Future of Power Electronics for Photovoltaics", IEEE Applied Power Electronics Conference, Feb. 2009.
Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
Cheng K.W.E., "New Generation of Switched Capacitor Converters", Department of Electrical Engineering, The Hong Kong Polytechnic University, Hung Hom, Hong Kong, Power Electronics Conference, 1998, PESC 98.
Per Karlsson, "Quasi Resonant DC Link Converters—Analysis and Design for a Battery Charger Application", Universitetstryckeriet, Lund University, 1999, ISBN 91-88934-14-4.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Yuang-Shung Lee et al.,"A Novel QR ZCS Switched-Capacitor Bidirectional Converter", IEEE, 2007.
Antti Tolvanen et al., "Seminar on Solar Simulation Standards and Measurement Principles", May 9th, 2006 Hawaii.
Ciobotaru, et al., Control of single-stage single-phase PV inverter, Aug. 7, 2006.
International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Esram, et al., "Comparison of Photovoltaic Array Maximum Power Point Tracking Techniques", IEEE Transactions on Energy Conversion, vol. 22, No. 2, Jun. 2007, pp. 439-449.
International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Façade with 100 W AC Photovoltaic Modules", 1996 IEEE, 25th PVSC, May 13-17, 1996, pp. 1235-1238, Washington, DC.
Alonso, et al., "Cascaded H-Bridge Multilevel Converter for Grid Connected Photovoltaic Generators with Independent Maximum Power Point Tracking of Each Solor Array", 2003 IEEE 34th, Annual Power Electronics Specialists Conference, Acapulco, Mexico, Jun. 15-19, 2003, pp. 731-735, vol. 2.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769-773.
Lindgren, "Topology for Decentralised Solar Energy Inverters with a Low Voltage AC-Bus", Chalmers University of Technology, Department of Electrical Power Engineering, EPE '99—Lausanne.
Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Palma, "A Modular Fuel Cell, Modular DC-DC Converter Concept for High Performance and Enhanced Reliability", IEEE 2007, pp. 2633-2638.
Quaschning, "Cost Effectiveness of Shadow Tolerant Photovoltaic Systems", Berlin University of Technology, Institute of Electrical Energy Technology, Renewable Energy Section. EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.

(56) References Cited

OTHER PUBLICATIONS

Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Matsui, et al. "A New Maximum Photovoltaic Power Tracking Control Scheme Based on Power Equilibrium at DC Link", IEEE, 1999, pp. 804-809.
International Preliminary Report on Patentability for PCT/IB2008/055092 dated Jun. 8, 2010.
International Search Report for PCT/IB2008/055092 dated Sep. 8, 2009.
Walker, "Cascaded DC-DC Converter Connection of Photovoltaic Modules", 33rd Annual IEEE Power Electronics Specialists Conference. PESC 2002. Conference Proceedings. Cairns, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), dated Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
United Kingdom Intellectual Property Office, Combined Search and Examination Report Under Sections 17 and 18(3), GB1020862.7, dated Jun. 16, 2011.
Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Fairchild Semiconductor, Application Note 9016, IGBT Basics 1, by K.S. OH Feb. 1, 2001.
"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.
Walker, "A DC Circuit Breaker for an Electric Vehicle Battery Pack", Australasian Universities Power Engineering Conference and IEAust Electric Energy Conference, Sep. 26-29, 1999.
Combined Search and Examination Report for GB1018872.0 dated Apr. 15, 2011, 2 pages.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
J.A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.
C. Liu et al., "Advanced Algorithm for MPPT Control of Photovoltaic Systems", Canadian Solar Buildings Conference, Montreal, Aug. 20-24, 2004.
Chihchiang Hua and Chihming Shen, "Study of Maximum Power Tracking Techniques and Control of DC/DC Converters for Photovoltaic Power System", IEEE 1998.
Tore Skjellnes et al., "Load sharing for parallel inverters without communication", Nordic Workshop in Power and Industrial Electronics, Aug. 12-14, 2002.
Giorgio Spiazzi at el., "A New Family of Zero-Current-Switching Variable Frequency dc-dc Converters", IEEE 2000.
Nayar, C.V., M. Ashari and W.W.L Keerthiphala, "A Gridinteractive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph. Strauss et al., "AC coupled PV Hybrid systems and Micro Grids-state of the art and future trends", 3rd World Conference on Photovoltaic Energy Conversion, Osaka, Japan May 11-18, 2003.
Nayar, C.V., abstract, Power Engineering Society Summer Meeting, 2000. IEEE, 2000, pp. 1280-1282 vol. 2.
D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automática / Sep. 12-16, 2010, Bonito-MS.
Sergio Busquets-Monge et al., "Multilevel Diode-clamped Converter for Photovoltaic Generators With Independent Voltage Control of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—dated Mar. 26, 2013.
Supplementary European Search Report—EP08857456—dated Dec. 6, 2013.
Extended European Search Report—EP14151651.8—dated Feb. 25, 2014.
Iyomori H et al: "Three-phase bridge power block module type auxiliary resonant AC link snubber-assisted soft switching inverter for distributed AC power supply", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998 (Dec. 17, 1998), XP055055241, Blacksburg, Virginia Retrieved from the Internet: URL:http:jscholar.lib.vt.edu/theses/available/etd-012299-165108/unrestricted/THESIS.PDF, [retreived on Mar. 5, 2013].
Yoshida M et al: "Actual efficiency and electromagnetic noises evaluations of a single inductor resonant AC link snubber-assisted three-phase soft-switching inverter", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.
Third party observation—EP07874025.5—dated Aug. 6, 2011.
Chen, et al., "Buck-Boost PWM Converters Having Two Independently Controlled Switches", IEEE Power Electronics Specialists Conference, Jun. 2001, Colorado Power Electronics Center Publications.
Chen, et al., "A New Low-Stress Buck-Boost Converter for Universal-Input PFC Applications", IEEE Applied Power Electronics Conference, Feb. 2001, Colorado Power Electronics Center Publications.

(56) References Cited

OTHER PUBLICATIONS

Walker, et al., "Photovoltaic DC-DC Module Integrated Converter for Novel Cascaded and Bypass Grid Connection Topologies—Design and Optimisation", 37th IEEE Power Electronics Specialists Conference, Jun. 18-22, 2006, Jeju, Korea.
Sandia Report SAND96-2797 I UC-1290 Unlimited Release, Printed Dec. 1996, "Photovoltaic Power Systems and the National Electrical Code: Suggested Practices", by John Wiles, Southwest Technology Development Institute New Mexico State University Las Cruces, NM.
John Xue, "PV Module Series String Balancing Converters", University of Queensland—School of Information Technology & Electrical Engineering, Nov. 6, 2002.
Mohammad Reza Amini et al., "Quasi Resonant DC Link Inverter with a Simple Auxiliary Circuit", Journal of Power Electronics, vol. 11, No. 1, Jan. 2011.
Walker, et al. "PV String Per-Module Maximum Power Point Enabling Converters", School of Information Technology and Electrical Engineering the University of Queensland, Sep. 28, 2003.
QT Technical Application Papers, "ABB Circuit-Breakers for Direct current Applications", ABB SACE S.p.A., An ABB Group Company, L.V. Breakers, Via Baioni, 35, 24123 Bergamo-Italy, Tel.: +39 035.395.111—Telefax: +39 035.395.306-433, Sep. 2007.

\* cited by examiner

FAST VOLTAGE LEVEL SHIFTER CIRCUIT

CROSS-REFERENCE TO RELATED APPLICATIONS

The present application claims priority to U.S. patent application Ser. No. 14/953,053, filed Nov. 27, 2015, which is a continuation of U.S. patent application Ser. No. 14/279,830, filed May 16, 2014, which is a continuation of U.S. patent application Ser. No. 13/015,064, filed Jan. 27, 2011, which claims priority to U.S. provisional application No. 61/298,555 filed on Jan. 27, 2010 by the present inventor, each of which is incorporated by reference herein as to their entireties.

BACKGROUND

1. Technical Field

The present invention relates to voltage level switching and, more particularly to a voltage level shifter circuit and a method for the operation of the voltage level shifter circuit.

2. Description of Related Art

Reference is now made to FIG. 1 which shows a current mirror circuit 10 according to conventional art. The base of a transistor $Q_1$ is connected to the base of a transistor $Q_2$, along with both of the emitters of $Q_1$ and $Q_2$ typically connected to ground or another common voltage point. A link connects the collector of $Q_1$ to the bases of $Q_1$ and $Q_2$. The collector of $Q_1$ also connects to voltage supply ($V_{cc}$) via a resistor R. The voltage output ($V_{out}$) of current mirror circuit 10 is between the collector of $Q_2$ and ground or between the collector of $Q_2$ and another voltage point.

Bipolar transistors such as $Q_1$ or $Q_2$ have a current gain ($\beta$) which is the ratio of the collector current to the base current. The relationship between $I_{REF}$ and $I_{OUT}$ is given by equation Eq. 1 below:

$$I_{OUT} = \left(\frac{\beta}{\beta+2}\right) I_{REF} \qquad \text{Eq. 1}$$

Where the current gain ($\beta$) is high $I_{REF}$ equals $I_{OUT}$ and $I_{REF}$ is said to 'mirror' $I_{OUT}$. The current being 'mirrored' can be, and sometimes is, a varying signal current. The current mirror is typically used to provide bias currents and active loads to circuits. Current mirrors may typically be constructed using various types of semiconductor switches such as a metal oxide semiconductor field effect transistor (MOSFET), field effect transistor (FET), insulated gate field effect transistor (IGFET), bipolar junction transistor (BJT) or Schottky transistor.

Reference is now made to FIG. 2 which shows a level shifter circuit 20 according to conventional art. Level shifter circuit 20 includes inverting amplifier A, resistors R1 and R2 (or equivalent loads), switches TCM1, TCM2, T1 and T2 which are preferably insulated gate field effect transistors (IGFETs). A current mirror circuit in level shifter circuit 20 is shown with the gate of IGFET TCM1 is connected to the gate (G) of a IGFET TCM2, along with both of the sources (S) of TCM1 and TCM2 typically connected to ground. A link connects the drain (D) of TCM1 to the gates (G) of TCM1 and TCM2. The drain (D) of TCM1 also connects to voltage supply ($V_{cc}$) via a resistor (not shown) to form current source I.

The drain of TCM2 connect to the sources (S) of IGFETS T1 and T2. The drain (D) of T1 connects to voltage supply ($V_{cc}$) through resistor R1. The drain (D) of T2 connects to voltage supply ($V_{cc}$) through resistor R2. The floating output voltage (Vf) of circuit 20 may be between voltage supply ($V_{cc}$) and node X or may be between voltage supply ($V_{cc}$) and node Y. Voltage input terminal (Control) is connected to the gate (C) of IGFET T2 and an inverse of voltage input terminal (Control) is connected to the gate (G) of IGFET T1 via inverting amplifier A.

In operation, shifter circuit 20 current I flows through resistors R1 or R2 which are referenced to floating output voltage (Vf) by virtue of current I flowing through resistors R1 or R2. The switching time for IGFETs T1 and T2 is typically a function of the miller drain capacitors of T1 and T2 plus all parasitic capacitances of T1 and T2 that are charged by the current I to a voltage swing value of the voltage input terminal (Control). IGFET T1 and resistor R1 are connected in circuit 20 as a common source (S) amplifier with output on node X common to the input from voltage input terminal Control. Similarly, IGFET T2 and resistor R2 are connected in circuit 20 as a common source (S) amplifier with output on node Y common to the inverse of input voltage input terminal Control. The bandwidth of the common-source amplifier typically tends to be low, due to high capacitance resulting from the Miller effect. The Miller effect accounts for the increase in the equivalent input capacitance of a common source (S) amplifier due to amplification of the capacitance between the input and output terminals. The additional input charge ($Q_{CM}$) due to the Miller effect for both IGFETs T1 or T2 is given by equation Eq. 2 below:

$$Q_{CM} = \frac{dV}{dt}(C_{GD} + C_{DS} + C_P) \qquad \text{Eq. 2}$$

$C_P$=Parasitic capacitance of the drain (D) of T1 or T2
$C_{GD}$=The capacitance between gate (C) and drain (D) of T1 or T2
$C_{DS}$=The capacitance between drain (D) and source (S) of T1 or T2
V=Voltage at node X for T1 or voltage at node Y for T2

Where even a small parasitic capacitance $C_{GD}$ between gate (G) and drain (D) may become a large influence in the frequency response and hence bandwidth of the common source amplifier. A low bandwidth due to the effect of Miller capacitance typically reduces switching speed of the common source amplifier. Additionally, with a level shifter like shifter circuit 20, the switching times of IGFETs T1 and T2 are typically proportional to current consumption in resistors R1 and R2 because current in resistors R1 and R2 charges the Miller capacitance ($C_M = C_P + C_{GD} + C_{DS}$).

The terms "field-effect transistor (FET) switch" is used herein interchangeably and equivalently with the term "bipolar junction transistor (BJT) switch". Whereby the gate of the FET switch is equivalent to the base of the BJT switch, the drain of the FET switch is equivalent to the collector of the BJT switch and the source of the FET switch is equivalent to the emitter of the BJT switch.

The term "leg of a switch" as used herein, refers to the actuation of a gate (of an FET) by application of a voltage to the gate for example, which causes a reduction in impedance between a drain and a source (of the FET). The reduction in impedance between the drain and the source (of the FET) is considered equivalent to the connection together of two contacts of a mechanical switch (e.g. single pole double throw switch (SPDT)).

The terms "charging" and "discharging" in the context of the present invention in reference to charging and discharging a capacitor, are used herein interchangeably except that current flow while charging and discharging is usually in the opposite direction.

The term "switch" as used herein refers to any of: silicon controlled rectifier (SCR), insulated gate bipolar junction transistor (IGBT), insulated gate field effect transistor (IGFET), bipolar junction transistor (BJT), field effect transistor (FET), junction field effect transistor (JFET), switching diode, mechanically operated single pole double pole switch (SPDT), SPDT electrical relay, SPDT reed relay, SPDT solid state relay, insulated gate field effect transistor (IGFET), diode for alternating current (DIAC), and triode for alternating current (TRIAC).

An ideal switch takes no time to go from off to on or from on to off. The switching time of the ideal switch is therefore zero. The term "switching time" as used herein refers to a finite period of time it takes for a switch to go from being in an "off" state to an "on" state or from the "on" state to the "off" state.

The terms "on" and "off" as used herein, when applied to a switch, refer to an increased current value flowing through the switch when the switch is "on" compared to the relative decreased current value flowing through the switch when the switch is "off".

The term "minimal current" as used herein refers to the relative decreased current value flowing through a switch when the switch is off when compared to an increased current value flowing through the switch when the switch is on.

BRIEF SUMMARY

According to embodiments of the present invention there is provided a voltage level shifting circuit with an input terminal and an output terminal. The level shifting circuit has a field-effect transistor (FET) switch with a gate attached to the input terminal, a drain attached to the output terminal and a source attached to a current changing mechanism. The current changing mechanism includes a current mirror circuit having an output connected between the source and an electrical earth. The output of the current mirror circuit is preferably adapted to change a current flowing between the drain and the source based on an input voltage applied to the gate. The input voltage typically produces an output voltage on the output terminal based on the current. A charge storage circuit may be operatively attached to the input terminal and an input of the current mirror circuit. The charge storage circuit may include a capacitor or a battery.

The charge storage circuit has an inverting amplifier with an input connected to the input terminal. A capacitor connected between an output of the inverting amplifier and an anode of a diode. A cathode of the diode is connected to the input of the current mirror circuit. A second diode with a second cathode connected to the anode of the diode and a second anode connected to the electrical earth. A second inverting amplifier with a second input connected to the output of the inverting amplifier. A second capacitor connected between a second output of the second inverting amplifier and a third anode of a third diode. A third cathode of the third diode is connected to the input of the current mirror circuit. A fourth diode with a fourth cathode connected to the third anode of the third diode and a third anode connected to the electrical earth.

According to embodiments of the present invention there is provided a voltage level shifting circuit with an input terminal and an output terminal. The level shifting circuit has a switch driven by an input voltage applied to the input terminal to produce an output voltage on the output terminal based on a current drawn through the switch. The switch may be a silicon controlled rectifier (SCR), insulated gate bipolar junction transistor (IGBT), bipolar junction transistor (BJT), field effect transistor (FET), junction field effect transistor (JFET), switching diode, electrical relay, reed relay, solid state relay, insulated gate field effect transistor (IGFET), diode for alternating current (DIAC), or triode for alternating current TRIAC. A current changing mechanism operatively connected to the switch. The current changing mechanism is preferably adapted for changing the current through the switch. The current changing mechanism is typically adapted to change the current when the switch is switched. The current changing mechanism is preferably adapted to provide a current control signal to a leg of the switch.

The level shifting circuit optionally includes further, a current mirror circuit having an output connected between the switch and an electrical earth. A charge storage circuit operatively attached to the input terminal and an input of the current mirror circuit and a second charge storage circuit operatively attached to the output terminal. The second charge storage circuit may include either a capacitor or a battery.

According to embodiments of the present invention there is provided a method to operate a voltage level shifting circuit. The level shifting circuit typically includes a switch which has an input terminal and an output terminal and a current mirror circuit having a current-mirror circuit output. The switch is connected in series with the current-mirror circuit output and an electrical earth, wherein a charge storage circuit is attached to the input terminal and an input of the current mirror circuit.

The method applies a voltage on the input terminal thereby driving a current through the switch and the current-mirror circuit output. The current is preferably a minimal value prior to the applying of the voltage. The charge storage circuit is typically charged prior to the applying of the voltage. The driving typically provides a voltage on the output terminal. The current is preferably increased by a discharge of the charge storage circuit into the input of the current mirror circuit. The current is preferably increased by switching the switch on. The current may also be increased at a time just prior to the switching the switch on. The current is preferably decreased by switching the switch off. The current may be further decreased by a charge of said charge storage circuit from said input of said current mirror circuit.

BRIEF DESCRIPTION OF THE DRAWINGS

The invention is herein described, by way of example only, with reference to the accompanying drawings, wherein.

DETAILED DESCRIPTION

Figure 1:
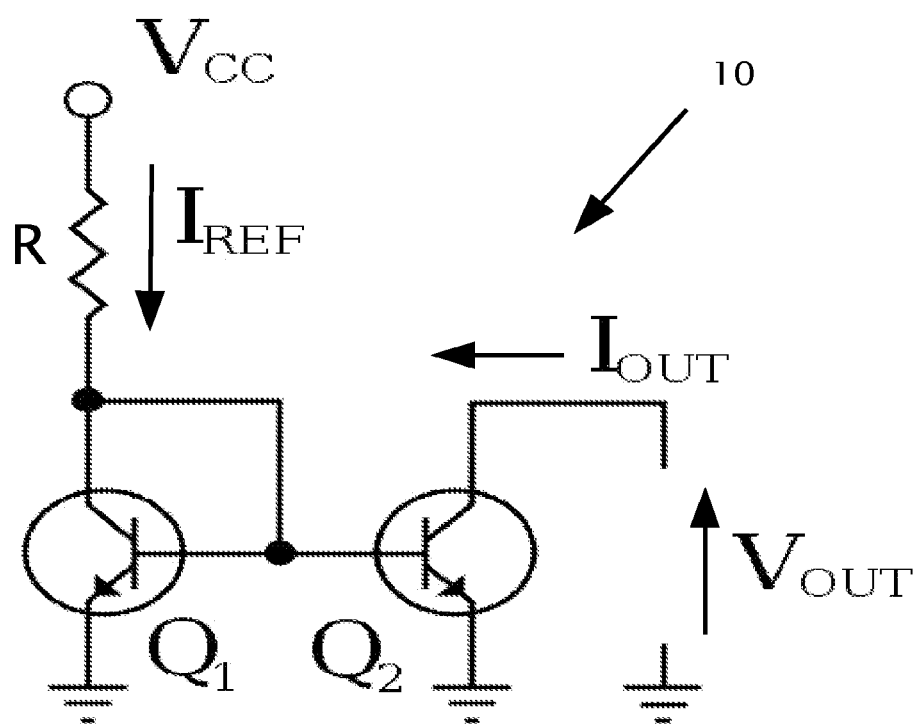
FIG. 1 shows a current mirror circuit according to conventional art.
Figure 2:
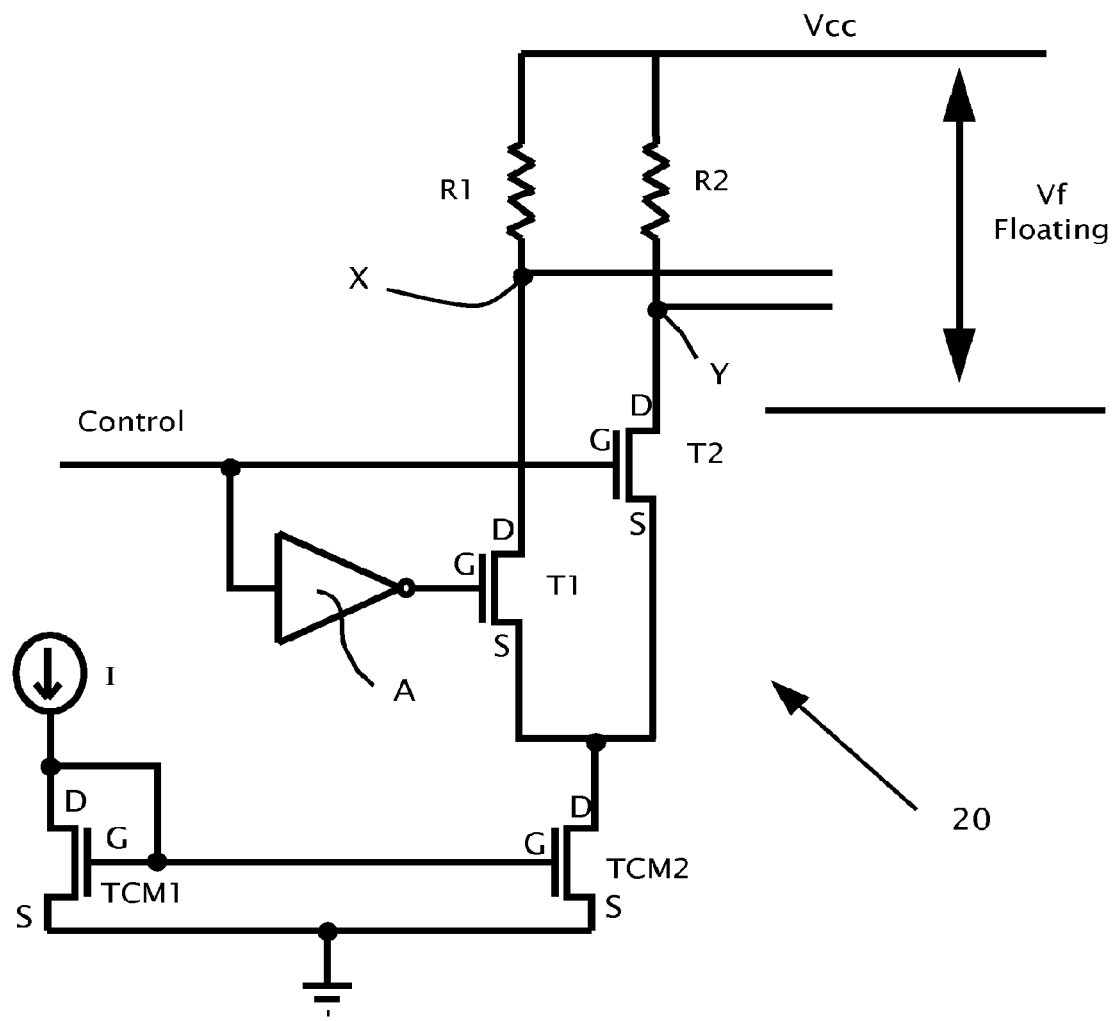
FIG. 2 shows a level shifter circuit according to conventional art.

Reference will now be made in detail to embodiments of the present invention, examples of which are illustrated in the accompanying drawings, wherein like reference numerals refer to the like elements throughout. The embodiments are described below to explain the present invention by referring to the figures.

Before explaining embodiments of the invention in detail, it is to be understood that the invention is not limited in its application to the details of design and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

By way of introduction, an embodiment of the present invention is directed to allow high current consumption only in the switching time. After the switching time, current is typically reduced to maintain low current consumption and allow for current overflow (by use of diodes) to the output floating voltage of the shifter circuit.

Figure 3A:
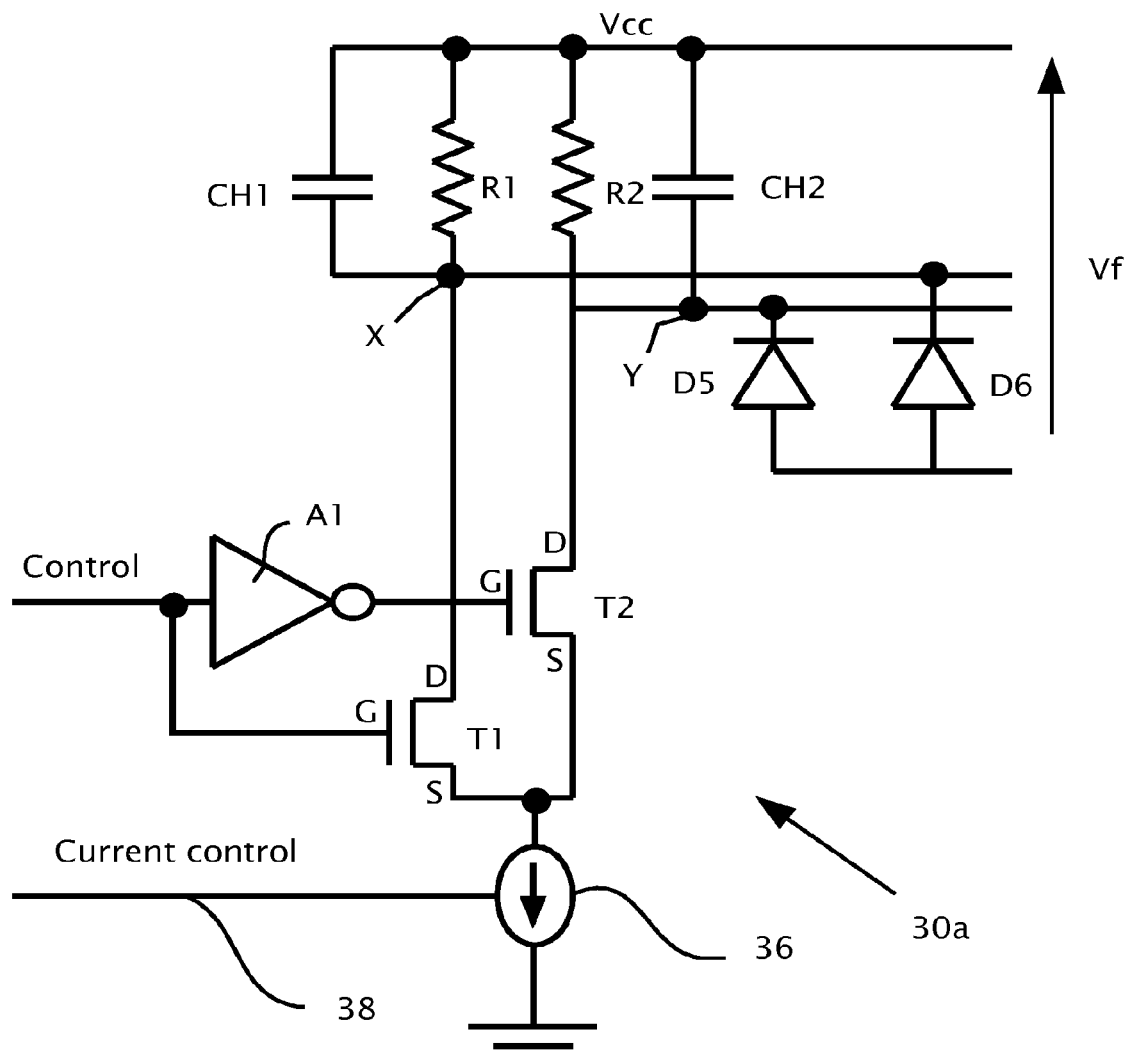
FIG. 3*a* shows a general circuit diagram of a level shifter circuit, according to an embodiment of the present invention.

Reference is now made to FIG. 3a which shows a general circuit diagram of a level shifter circuit 30a, according to an embodiment of the present invention. The drain (D) of T1 connects to voltage supply ($V_{cc}$) through resistor R1. The drain (D) of T2 connects to voltage supply ($V_{cc}$) through resistor R2. Capacitor CH1 is connected in parallel with resistor R1. Capacitor CH2 is connected in parallel with resistor R2. The anode of diode D6 is connected to the anode of diode D5. The connected anodes of D5 and D6 may provide one output terminal of floating output voltage Vf. The other terminal of floating output voltage Vf is connected to voltage power supply $V_{cc}$. The cathode of diode D6 is connected to node X and the cathode of diode D5 is connected to node Y. Voltage input terminal (Control) is connected to the gate (G) of IGFET T1 and an inverse of voltage input terminal (Control) is connected to the gate (G) of IGFET T2 via inverting amplifier A1. The sources (S) of IGFET T1 and T2 are connected together and connect to one end of current controlled source 36. The other end of source 36 is connected to electrical earth. Flow of current through source 36 is controlled by current control line 38.

Figure 3B:
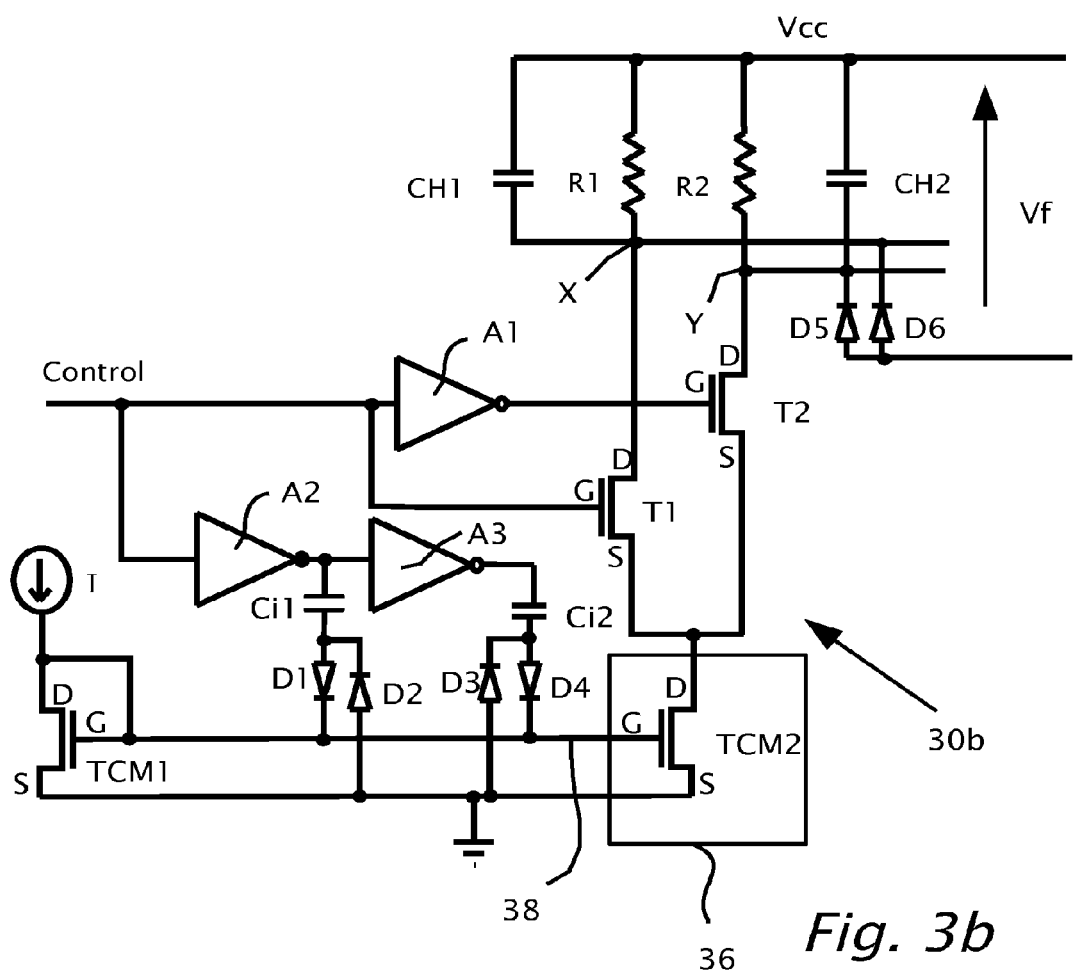
FIG. 3*b* shows a level shifter circuit, according to an embodiment of the present invention.

Reference is now made to FIG. 3b which shows a level shifter circuit 30b, according to an embodiment of the present invention. Level shifter 30b is a more detailed embodiment of level circuit 30a shown in FIG. 3a. Shifter circuit 30b additionally includes inverting amplifiers A1, A2 and A3, capacitors CH1 and CH2 and diodes D1, D2, D3, D4, D5 and D6. Switches TCM1, TCM2, T1 and T2 which are preferably insulated gate field effect transistors (IGFETs). A current mirror circuit in level shifter circuit 30b is shown with the gate of IGFET TCM1 is connected to the gate (G) of a IGFET TCM2, along with both of the sources (S) of TCM1 and TCM2 typically connected to ground. A link connects the drain (D) of TCM1 to the gates (G) of TCM1 and TCM2. The drain (D) of TCM1 also connects to voltage supply ($V_{cc}$) via a resistor (not shown) to form current source I.

The drain of TCM2 connect to the sources (S) of IGFETS T1 and T2. The drain (D) of T1 connects to voltage supply ($V_{cc}$) through resistor R1. The drain (D) of T2 connects to voltage supply ($V_{cc}$) through resistor R2. Capacitor CH1 is connected in parallel with resistor R1. Capacitor CH2 is connected in parallel with resistor R2. The anode of diode D6 is connected to the anode of diode D5. The connected anodes of D5 and D6 may provide one output terminal of floating output voltage Vf. The other terminal of floating output voltage Vf is connected to voltage power supply $V_{cc}$. The cathode of diode D6 is connected to node X and the cathode of diode D5 is connected to node Y. Voltage input terminal (Control) is connected to the gate (G) of IGFET T1 and an inverse of voltage input terminal (Control) is connected to the gate (G) of IGFET T2 via inverting amplifier A1. Voltage input terminal (Control) is also connected to the input of inverting amplifier A2. The output of inverting amplifier A2 is connected to the input of inverting amplifier A3. The output of inverting amplifier A2 is also connected to one end of capacitor Ci1, the other end of capacitor Ci1 connects to the anode of diode D1 and the cathode of diode D2. The cathode of diode D1 connects to the gates (C) of switches TCM1 and TCM2. The anode of diode D2 connects to ground. The output of inverting amplifier A3 is connected to one end of capacitor Ci2, the other end of capacitor Ci2 connects to the anode of diode D4 and the cathode of diode D3. The cathode of diode D4 connects to the gates (G) of switches TCM1 and TCM2. The anode of diode D3 connects to ground. Switch TCM2 is the realization of current controlled source 36 shown in FIG. 3a along with current control line 38 provided by the connection to the gate (G) of switch TCM2.

Figure 4:
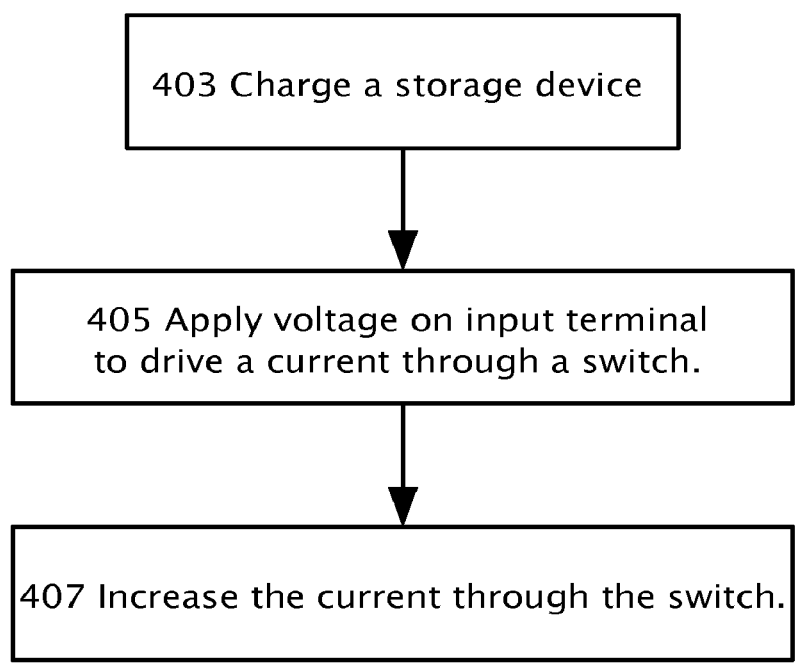
FIG. 4 shows a method to operate the level shifter circuit shown in FIG. 3b, according to an embodiment of the present invention.
Figure 4:

Reference is now made to FIG. 4 which shows a method 401 to operate level shifter circuit 30b shown in FIG. 3, according to an embodiment of the present invention. The explanation of method 401 that follows, relies for the most part on the circuit symmetry of level shifter circuit 30b operating in a dynamic mode of operation and as such reference will be made to one half of circuit 30b, namely the operation of switch T1 and associated components. Accordingly as such, the operation of switch T1 during the dynamic mode of operation of circuit 30b typically corresponds to the opposite operation of switch T2 and associated components. That is to say, by virtue of inverting amplifier A1, when switch T1 is switched on, switch T2 is switched off and vice versa. Similarly, by virtue of amplifiers A2 and A3 the charging of capacitor Ci1 via diodes D1 and D2 corresponds to the opposite charging of capacitor Ci2 via diodes D4 and D3 respectively and vice versa. Additionally by virtue switch T1 being on and switch T2 off and vice versa, the charging of capacitor CH1 and diode D6 corresponds to the opposite charging of capacitor CH2 and diode D5 respectively.

During quiescent operation of circuit 30b when no voltage is applied to voltage input terminal (Control), capacitors Ci1 and Ci2 are charged (step 403). Current I is at a minimal value and both switches T1 and T2 are off.

During the dynamic mode of operation, voltage input terminal (Control) has a voltage level applied (step 405) such that switch T1 is turned on and transistor T2 is turned off. The current I is pushed high by the discharge of capacitor Ci1 and consequently the current through switch T1, which mirrors current I, is increased (step 407). The change in current I, causes the output voltage Vf to vary in sympathy with the input voltage effectively causing a voltage level shift of the input voltage applied to voltage input terminal (Control) in step 405. The increased current through switch T1 quickly charges floating capacitor CH1 and Miller capacitance of switch T1, which reduces the switching time of switch T1. Overflow of the charging of capacitor CH1 is typically discharged by diode D6.

Shifter circuit 30b can either use or not use capacitors CH1 and CH2. The reason for capacitors CH1 and CH2 is to prevent a mismatch of the level shifter circuit 30b output via switches T1 and T2 not being matched.

The definite articles "a", "an" is used herein, such as "a charge storage circuit", "a switch" have the meaning of "one or more" that is "one or more charge storage circuits" or "one or more switches".

Although selected embodiments of the present invention have been shown and described, it is to be understood the present invention is not limited to the described embodiments. Instead, it is to be appreciated that changes may be made to these embodiments without departing from the principles and spirit of the invention, the scope of which is defined by the claims and the equivalents thereof.

The invention claimed is:

1. A circuit comprising:
   a first circuit portion comprising a first switch and a resistor and configured to produce, responsive to an input voltage to a control input of the first switch, an output voltage by passing current through the resistor and the first switch;
   a second circuit portion comprising a second switch and configured to draw, responsive to a control input of the second switch, the current through the first switch and the resistor; and
   a third circuit portion comprising a charge storage device and configured to discharge into the control input of the second switch, responsive to the input voltage, a charge stored in the charge storage device, wherein the third circuit portion is configured to control the second circuit portion to decrease, in response to the input voltage being unchanged, the current through the first switch and the resistor.

2. The circuit of claim 1, wherein the third circuit portion is configured to control the second circuit portion to increase, in response to a change in the input voltage, the current through the first switch and the resistor.

3. The circuit of claim 1, wherein the first circuit portion comprises a level shifting circuit.

4. The circuit of claim 1, wherein the second circuit portion comprises a current mirror circuit.

5. The circuit of claim 1, wherein the charge storage device is connected to the input voltage via an inverting amplifier, and wherein the control input of the first switch is configured to receive the input voltage without inversion.

6. The circuit of claim 1, wherein each of the first switch and the second switch is selected from a group consisting of: a silicon controlled rectifier (SCR), an insulated gate bipolar junction transistor (IGBT), a bipolar junction transistor (BJT), a field effect transistor (FET), a junction field effect transistor (JFET), a switching diode, an electrical relay, a reed relay, a solid state relay, an insulated gate field effect transistor (IGFET), a diode for alternating current (DIAC), and a triode for alternating current TRIAC.

7. The circuit of claim 1, wherein the first circuit portion is connected between a voltage source and the second circuit portion, and wherein the second circuit portion is connected between the first circuit portion and ground.

8. A circuit comprising:
   a first switch having a control input connected to a first node, wherein the first switch is further connected between a second node and a third node;
   a current-controlled source connected to the third node and comprising a control input connected to a fourth node; and
   a charge storage circuit connected between the first node and comprising a control input connected to the fourth node, wherein the charge storage circuit is configured to control the current-controlled source to increase, in response to a change in voltage at the first node, a current through the first switch between the second node and the third node, wherein the charge storage circuit is further configured to control the current-controlled source to increase the current by discharging a stored charge into the fourth node.

9. The circuit of claim 8, wherein the charge storage circuit is further configured to control the current-controlled source to decrease, in response to the voltage at the first node being unchanged, the current through the first switch between the second node and the third node.

10. The circuit of claim 8, wherein the charge storage circuit comprises a first capacitor and a second capacitor, the circuit further comprising:
    a first inverting amplifier comprising an input connected to the first node and comprising an output connected to the first capacitor; and
    a second inverting amplifier comprising an input connected to the output of the first inverting amplifier and comprising an output connected to the second capacitor.

11. The circuit of claim 8, further comprising an inverting amplifier and a second switch, wherein the control input of the first switch is directly connected to the first node and a control input of the second switch is connected to the first node via the inverting amplifier, wherein the second switch is further connected between a fifth node and the third node.

12. The circuit of claim 8, wherein the first switch is selected from a group consisting of: a silicon controlled rectifier (SCR), an insulated gate bipolar junction transistor (IGBT), a bipolar junction transistor (BJT), a field effect transistor (FET), a junction field effect transistor (JFET), a switching diode, an electrical relay, a reed relay, a solid state relay, an insulated gate field effect transistor (IGFET), a diode for alternating current (DIAC), and a triode for alternating current TRIAC.

13. The circuit of claim 8, wherein the second node is connected between a voltage source and the first switch, and wherein the current-controlled source is connected between the third node and ground.

14. The circuit of claim 8, further comprising a first voltage output node connected to the second node via a diode and a second voltage output node connected to the second node via a resistor.

15. A circuit comprising:
    a first circuit portion comprising a first switch and a resistor and configured to produce, responsive to an input voltage to a control input of the first switch, an output voltage by passing current through the resistor and the first switch;
    a current mirror comprising a second switch and configured to draw, responsive to a control input of the second switch, the current through the first switch and the resistor; and
    a second circuit portion comprising a charge storage device and configured to discharge into the control input of the second switch, responsive to the input voltage, a charge stored in the charge storage device.

16. The circuit of claim 15, wherein the second circuit portion is configured to control the current mirror to increase, in response to a change in the input voltage, the current through the first switch and the resistor.

17. The circuit of claim 15, wherein the second circuit portion is configured to control the current mirror to decrease, in response to the input voltage being unchanged, the current through the first switch and the resistor.

18. The circuit of claim 15, wherein the first circuit portion comprises a level shifting circuit.

19. The circuit of claim 15, wherein the charge storage device is connected to the input voltage via an inverting amplifier, and wherein the control input of the first switch is configured to receive the input voltage without inversion.

20. The circuit of claim 15, wherein the first circuit portion is connected between a voltage source and the current mirror, and wherein the current mirror is connected between the first circuit portion and ground.

* * * * *